2/26/80 XR 4,190,783

United States Patent [19]

Massa

[11] 4,190,783

[45] Feb. 26, 1980

[54] ELECTROACOUSTIC TRANSDUCERS OF THE BI-LAMINAR FLEXURAL VIBRATING TYPE WITH AN ACOUSTIC DELAY LINE

[75] Inventor: Frank Massa, Randolph, Mass.

[73] Assignee: The Stoneleigh Trust, Fred M. Dellorfano, Jr. & Donald P. Massa, Trustees, Cohasset, Mass.

[21] Appl. No.: 927,893

[22] Filed: Jul. 25, 1978

[51] Int. Cl.² ............................................ H01L 41/10

[52] U.S. Cl. .................................... 310/324; 310/335; 179/110 A

[58] Field of Search ............... 310/324, 330, 331, 332, 310/334, 335

[56] References Cited

U.S. PATENT DOCUMENTS

| | | | |
|---|---|---|---|
| 2,967,957 | 1/1961 | Massa | 310/324 |
| 3,271,596 | 9/1966 | Brinkerhoff | 310/324 |
| 3,360,664 | 12/1967 | Straube | 310/330 |
| 3,849,679 | 11/1974 | Massa | 310/324 |
| 3,937,991 | 2/1976 | Massa et al. | 310/324 |

*Primary Examiner*—Mark O. Budd

[57] ABSTRACT

An improved transducer utilizes an acoustic delay line to reverse the phase of the sound vibrations generated by the peripheral area of a bi-laminar vibratile disc operating at its free fundamental resonance mode. When the diameter of the vibratile disc is dimensioned within specific limits in comparison with the wavelength of sound being radiated at the frequency of operation, the radiation efficiency of the transducer is significantly increased over the efficiency of the same vibratile disc operating in the prior art manner with an acoustic shield placed over the peripheral area of the disc to prevent destructive interference from the out-of-phase sound radiation generated by the peripheral area.

10 Claims, 7 Drawing Figures

ELECTROACOUSTIC TRANSDUCERS OF THE BI-LAMINAR FLEXURAL VIBRATING TYPE WITH AN ACOUSTIC DELAY LINE

This invention is concerned with improvements in the design of bi-laminar vibratile electroacoustic transducers and, more particularly, with bi-laminar vibratile plates operating in the free flexural fundamental resonant mode. A prior art example of a vibratile bi-laminar transducer improved by this invention is shown in U.S. Pat. No. 2,967,957, in which FIG. 15 illustrates a basic design of a bi-laminar vibratile disc assembly which comprises a metallic disc 30 bonded to a piezoelectric ceramic disc 3. FIGS. 16 and 17 of the reference patent illustrate the deflection curve of the bi-laminar disc assembly when an alternating potential is applied first in the positive and then in the negative direction across the electrode surfaces of the piezoelectric ceramic. When the frequency of the alternating potential applied to the ceramic disc is near the free resonant frequency of the element assembly, the composite disc will vibrate at maximum amplitude for a given applied voltage. As mentioned in the reference patent, when the bi-laminar disc assembly is operating at its free resonant frequency mode, the center portion of the vibratile structure vibrates out-of-phase with the peripheral portion of the assembly. In order to prevent destructive interference from the central and peripheral vibrations of the bi-laminar plate, the peripheral portion of the disc is prevented from radiating by covering the peripheral surface with a resilient washer-like member 17 which acts as an acoustic shield, thereby exposing only the central area of the vibratile plate assembly for radiating sound into the medium.

The prior art transducer design described in the reference patent successfully prevents destructive phase interference from the out-of-phase vibrating portions of the central and peripheral regions of the bi-laminar disc by suppressing the radiation from the peripheral area of the disc when it is operating at its free fundamental resonant mode. This prior art design has been commercially successful as evidenced by the manufacture and sale of several million transducers of the type described. In spite of the commercial success of the prior design, there are two disadvantages that limit the use of the transducer for some applications. The first disadvantage resulted from the use of the acoustic shield over the peripheral area of the vibrating structure which reduced the effective radiating area of the disc, which, in turn, reduced the radiation efficiency of the transducer. The second disadvantage resulted from the open configuration of the design which made it difficult to moisture-proof the assembly; therefore, it could not be generally used for outdoor applications.

The present construction removes the limitations inherent in the early design, and achieves optimum transducer performance by utilizing the entire surface area of the bi-laminar assembly for the purpose of radiating sound.

The primary object of this invention is to improve the design of a bi-laminar vibratile plate transducer for operating at its free fundamental resonant mode of vibration.

Another object of the invention is to provide an acoustic delay line as part of the transducer assembly which reverses the phase of the radiation from the peripheral portion of the surface of the vibratile plate when it is vibrating at its free flexural fundamental resonant mode, and additively combines the phase-shifted radiation with the radiation from the central portion of the vibrating surface.

A still further object of the invention is to provide a peripheral suspension for the bi-laminar transducer element which flexibly seals the periphery of the vibrating disc to the transducer housing and does not significantly impede the free peripheral flexural vibration of the disc.

Another object of the invention is to achieve improved performance with a simplified structure that uses fewer parts and results in lower production cost over prior art designs.

Additional objects will become more apparent to those skilled in the art by the description of the invention which follows, when taken with the accompanying drawings in which.

Figure 2:
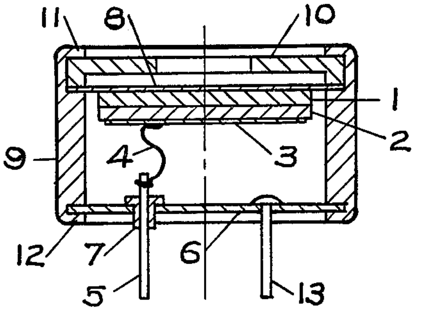
FIG. 2 is a section taken along the line 2—2 of FIG. 1.

Referring more particularly to the figures, a bi-laminar vibratile plate transducer construction is illustrated which comprises a metallic disc 1 bonded to a piezoelectric ceramic disc 2 in the conventional manner, such as by the use of conducting epoxy, as is well known in the art. To the electrode surface 3 of the ceramic disc is soldered one end of a flexible conductor 4. The opposite end of the conductor is soldered to the insulated terminal 5 which is attached to a metal disc 6 which serves as a closure for the housing structure 9. The terminal 5 is insulated from the disc 6 by an insulating bushing 7. The opposite electrode surface of the ceramic disc 2 (not shown) is bonded to the surface of the metallic plate 1 in the conventional manner by using conducting cement, as is well known in the art. The bi-laminar plate assembly is, in turn, bonded with conducting cement to the metallic membrane or thin metal foil 8, as illustrated in FIG. 2. A cylindrical housing structure 9 is dimensioned to receive the metal membrane support member 8, as shown. The plate member 10, which performs the phase-shifting function to be described later, is placed in close proximity to the surface of the membrane 8, as illustrated, and the thinned wall portion 11 of the housing structure is crimped over the peripheral edge of the plate 10 is securely clamp the peripheries of the assembled elements, and to establish electrical connection from the top electrode of the ceramic (not shown) through the metal disc 1 amd metal membrane support member 8 to the housing member 9. The opposite thin-walled end 12 of the housing 9 is crimped over the edge of the metallic terminal board 6, thereby completing the transducer assembly. The terminal 13, which is rivetted or welded to the terminal board 6, serves as the ground terminal for establishing electrical connection to the electrode surface of the ceramic which is bonded to the metallic disc 1.

Figure 3:
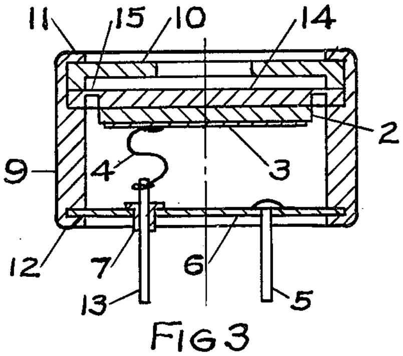
FIG. 3 is an alternate construction of the inventive transducer in which the flexible peripheral suspension is achieved by the under-cut web portion of the one-piece structure that includes the vibratile disc portion at its center.

FIG. 3 shows an alternate design for the vibratile structure of FIG. 2 in which the disc 1 and membrane 8 of FIG. 2 are replaced by a single fabricated metallic structure 14 which includes an under-cut thin annulus portion 15 to serve as the flexible suspension member for the periphery of the central disc portion of plate 14. In either construction of FIG. 2 or FIG. 3, the necessary requirement to be met by the flexible suspension annulus of the mounting structure is that the flexural stiffness of the suspension annulus must be much lower than the flexural stiffness of the bi-laminar ceramic and disc assembly in order that the suspension will not have any significant influence in inhibiting the free flexural resonant mode of vibration of the bi-laminar disc assembly. In other words, the periphery of the bi-laminar disc must be free to flex and bend without appreciable restraint from the suspension system. The suspension system, as described, also serves as a moisture-proof seal for protecting the ceramic 2 which permits the use of the inventive transducer out-of-doors, if desired, without damage to the ceramic element from moisture.

Figure 1:
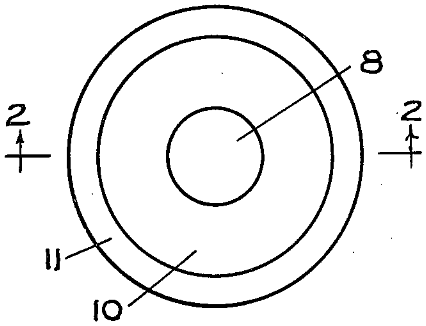
FIG. 1 is a plan view looking at the top of the inventive transducer assembly.
Figure 4:
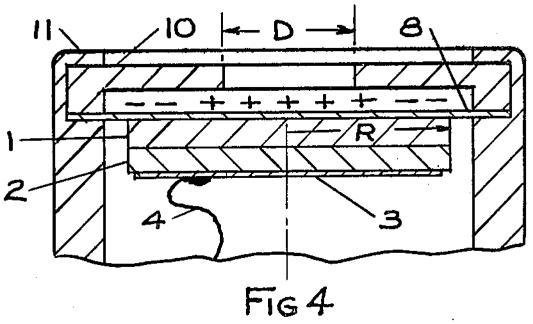
FIG. 4 shows an enlarged cross-sectional view of the vibratile bi-laminar disc combined with the inventive phase-shifting acoustic delay line which reverses the phase of the peripheral radiation from the vibratile disc, and then combines the phase-shifted radiation with the radiation from the central portion of the vibratile disc, thereby achieving increased radiation efficiency.

The function of the plate member 10 in shifting the phase of the sound radiation from the peripheral area of the vibratile disc assembly when it is operating at its free fundamental resonant mode will be explained with the aid of FIG. 4 which is an enlarged view of the top portion of FIG. 2. The recessed under portion of plate 10, when assembled as illustrated in FIG. 4, forms a sealed chamber in close proximity to the upper surface of the vibratile disc assembly, as shown. The + and − signs indicate the relative phases of the central and peripheral vibrating portions of the vibratile disc when it is vibrating at the free flexural fundamental resonant mode. The change in phase occurs at the nodal diameter of the vibratile disc which remains as a stationary line when the vibratile assembly is operating at the fundamental free resonant mode. The nodal circle divides the area of the vibratile disc into two approximately equal parts; therefore, the central area portion illustrated as vibrating with + phase is approximately equal to the peripheral area illustrated as vibrating with − phase. The function of the plate 10 is to introduce a time delay for the sound vibrations generated by the peripheral area of the bi-laminar disc before the vibrations are permitted to join the sound vibrations generated by the center of the disc assembly. In order to achieve constructive addition of the peripheral vibrations, it is necessary that the distance R shown in FIG. 4, which is the radius of the bi-laminar disc, be greater than ¼ wavelength and less than ¾ wavelength of the sound in the medium at the frequency of operation, or equivalently stated, the diametrical dimensions of the disc must be greater than ½ wavelength and less than 1½ wavelength of the radiated sound. It is also necessary for achieving optimum performance that the area of the hole in the plate 10 be preferably no greater than ½ the area of the vibratile bi-laminar disc. This means that to obtain the advantages of the newly-disclosed transducer construction, some very specific limitations must be satisfied in the dimensions of the components described.

Referring to FIG. 4, the following conditions must be satisfied in order to obtain optimum performance from the inventive design and to achieve optimum radiation efficiency from the vibratile disc assembly:

1. The radius R of the vibratile disc assembly must be greater than ¼ wavelength and less than ¾ wavelength of the sound radiated in the medium at the frequency of operation of the transducer, or equivalently stated, the diametrical dimensions of the vibratile plate assembly, if the plate is not circular, must be greater than ½ wavelength and less than 1½ wavelength at the operating frequency.

2. The area of the opening in the phase-shifting plate 10 must not exceed 50% of the area of the vibratile disc assembly.

3. The flexural stiffness of the peripheral suspension member must be much lower than the flexural stiffness of the vibratile disc assembly.

4. The peripheral suspension member must form an acoustic seal at the periphery of the vibratile disc to prevent phase cancellation of sound from the front to back surface of the vibrating disc which would otherwise occur without an acoustic barrier at the peripheral edge of the assembly.

Figure 5:
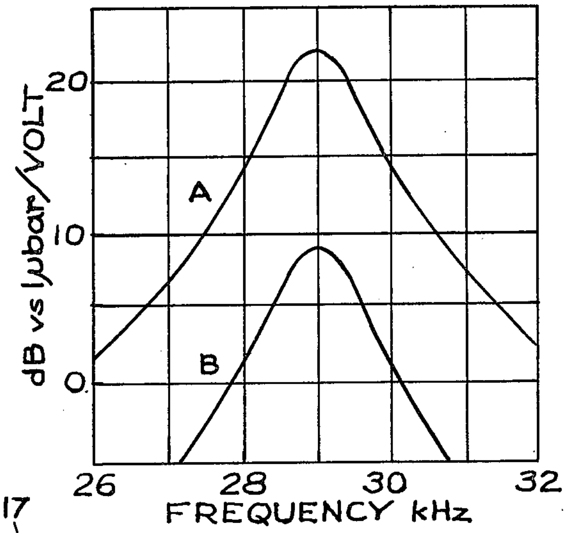
FIG. 5 shows the improved sensitivity of the inventive transducer utilizing the inventive phase-shifting acoustic delay line compared with the sensitivity of the same bi-laminar disc using the prior art acoustic shield over the peripheral surface of the disc.

FIG. 5 shows experimental test data which indicates the actual sensitivity improvement obtained with the newly-disclosed design. Curve A shows the measured sound pressure in dB vs. 1 microbar generated at 1 ft. distance for 1 volt applied to the ceramic plate. The diameter of the vibratile disc assembly used for the experimental model is 9/16 inch, and the diameter of the hole in the phase-shifting acoustic transmission line 10 is ⅜ inch. Curve B shows the measured sound pressure for the same vibratile structure when a foam rubber washer was placed over the peripheral area of the vibratile disc to prevent the radiation of sound from the peripheral surface outside the nodal diameter of the disc. The large increase in sensitivity shown in Curve A indicates the improvement in performance achieved by the inventive design using the acoustic delay line over the prior art construction which uses an acoustic shield over the peripheral area of the vibratile disc.

Figure 6:
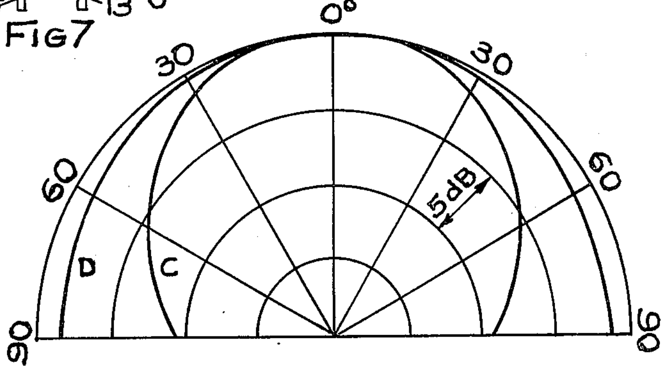
FIG. 6 shows the variation in the directional response pattern that can be achieved in the inventive transducer by simply changing the size of the opening at the center of the acoustic transmission line.

FIG. 6 shows the variation in directional response characteristics that can be achieved by simply varying the diameter of the opening in the acoustic delay line plate member 10. Curve C shows the measured directional response obtained for a ⅜" diameter opening, and curve D shows the directional response obtained for a 3/16" diameter opening.

Figure 7:
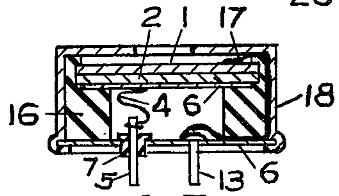
FIG. 7 shows another alternate construction for the inventive transducer in which the peripheral suspension for the vibratile disc is achieved by a resilient rubber-like member which flexibly supports and positions the bi-laminar disc relative to the opening in the housing.

FIG. 7 illustrates another alternate construction of the inventive transducer in which the vibratile disc assembly is flexibly supported at its periphery by the resiliant tubular support member 16 which is preferably a foam rubber-like material with a closed cellular structure to prevent circulation of sound vibrations around the peripheral edge of the disc assembly. The disc assembly may be nested in a suitable groove which is molded into the wall of the tubular support member 16, as illustrated. A wire 17 is connected to the metal plate 1, and after passing over the top of the support member 16 and down between the outer wall of the support member and the inner wall of the housing structure 18, the wire is attached to the terminal 13 to establish electrical connection through the plate 1 to the ceramic element 2. If a molded groove in the wall of the support member 16 is used for mounting the disc assembly, as illustrated, it is important to minimize the overhanging "lip" dimension, which is shown projecting over the top peripheral rim portion of the disc assembly in FIG. 7, because the overhanging portion of the resilient support member 16 will act as an acoustic shield to suppress the sound radiation from the covered rim portion of the vibratile area of the disc assembly.

If all or most of the overhanging lip portion of the groove is eliminated from the flexible support member 16, practically the entire peripheral area of the vibratile disc will be free to radiate sound, and maximum radiation efficiency will be achieved. If the overhanging projecting lip portion of the flexible support member 16 is totally removed, it will be necessary to attach the peripheral surface of the vibratile disc assembly to the surface of the flexible support member 16 on which the disc rests to prevent the disc assembly from becoming displaced from the desired position. This can be accomplished by the use of a suitable cement between the surface of the disc and the support member which may be applied in a few spots, preferably in the vicinity of the nodal diameter of the vibratile disc to minimize damping losses that might otherwise be introduced by some types of cement. The cement may be eliminated if a few peripheral tab portions from the overhanging lip of the flexible support member 16 are allowed to remain as a part of the molded flexible support member 16 when the remainder of the overhanging lip portion is removed from the support structure. The negligible area of the small remaining overhanging tab portions will not shield any appreciable portion of the total vibratile area of the disc assembly, and thus will maintain the high radiation efficiency of the inventive transducer. The flexible support member 16, illustrated in FIG. 7, completely supports the vibratile disc assembly, and also spaces the vibrating surface of the disc from the flat end surface of the housing structure 18 which serves as the acoustic delay line, as previously described. The simplified construction illustrated in FIG. 7 further reduces the cost of the improved transducer.

The inventive structure, in addition to achieving improved efficiency over the prior art design, uses fewer parts in the assembly, and thus achieves lower production cost. The new design also permits a wide flexibility in changing the beam width of the radiation pattern of the transducer by simply changing the size of the hole in the cover plate 10. With former designs, it is expensive and difficult to vary the beam angle because it requires making changes in the dimensions of the bi-laminar vibratile disc portion of the vibrating system.

While a few specific embodiments of the present invention have been shown and described, it should be understood that various additional modifications and alternative constructions may be made without departing from the true spirit and scope of the invention. Therefore, the appended claims are intended to cover all such equivalent alternative constructions that fall within their true spirit and scope.

I claim:

1. In combination in an electroacoustic transducer, a flexurally vibratile plate assembly comprising a plurality of bonded plates at least one of which is capable of changing its dimensions upon being subjected to the influence of an electrical signal, suspension means for supporting said vibraplate assembly, said suspension means characterized in that the flexural stiffness of said suspension means is less than the flexural stiffness of said vibratile plate assembly whereby said suspension means does not significantly impede the free flexural displacement of the vibratile plate assembly when it is operated at its fundamental free flexural resonant mode of vibration, said suspension means further characterized in that it provides an acoustic seal at the peripheral edge ofsaid vibratile plate to prevent the flow of sound vibrations between the opposite peripheral faces of said vibratile plate assembly when it is operating at its fundamental free resonant mode of vibration, said vibratile plate assembly further characterized in that when it is operating at its fundamental free resonant frequency mode, the displacement of the peripheral area of the vibratile surface of said vibratile plate assembly is of opposite phase compared with the displacement of the central area of said plate assembly, a second plate member having a center opening, said second plate member is positioned in close proximity to the vibratile surface of said vibratile plate assembly and positioned so that the center of the opening in said second plate is in alignment with the central portion of said vibratile plate assembly, said second plate member further characterized in that the area of the center opening does not exceed 50% of the total vibrating area of said vibratile plate assembly, the area of said vibratile plate assembly characterized in that the transverse dimensions of said vibratile plate assembly are greater than $\frac{1}{2}$ wavelength and less than $1\frac{1}{2}$ wavelength of sound in the medium at the frequency of operation.

2. In combination in an electroacoustic transducer, a flexurally vibratile plate assembly comprising a plurality of bonded discs at least one of which is a piezoelectric material which has the property of changing its radial dimension when a voltage is applied across the opposite surfaces of said piezoelectric disc, suspension means for supporting said vibratile disc assembly, said suspension means characterized in that the flexural stiffness of said suspension means is less than the flexural stiffness of said vibratile disc assembly, whereby said suspension means does not significantly impede the free flexural displacement of the peripheral edge of said vibratile disc assembly when it is vibrating at its fundamental free flexural resonant mode, said suspension means further characterized in that it provides an acoustic seal at the peripheral edge of said vibratile disc assembly to prevent the flow of sound between the opposite peripheral vibrating faces of said vibratile disc assembly when it is operating at its fundamental free resonant mode of vibration, said vibratile disc assembly further characterized in that when it is operating at its fundamental free resonant frequency mode of vibration, the displacement of the outer peripheral area of the vibratile surface of said disc assembly is of opposite phase compared with the displacement of the central area of the vibratile surface of said disc assembly, a second plate member having a center opening, said second plate member located in close proximity to the vibratile surface of said composite vibratile disc and positioned so that the center of the opening in said second plate is in alignment with the central area of said vibratile surface of said vibratile disc assembly, said plate member further characterized in that the area of the center opening does not exceed 50% of the area of the composite vibrating disc, the area of said composite vibratile disc characterized in that the radius of said vibratile disc is greater than ¼ wavelength and less than ¾ wavelength of the sound generated by said vibratile disc at the frequency of operation.

3. The invention in claim 2 further characterized in that said suspension means comprises a thin membrane attached to the surface of the vibratile disc and projecting beyond the diameter of said vibratile disc to form a flexible annulus for suspending the vibratile disc, a housing structure surrounding said vibratile disc and spaced from the peripheral edge of said vibratile disc, means for attaching the periphery of said membrane suspension member to said housing, whereby said vibratile disc becomes attached to said housing structure and said flexible annulus provides an acoustic seal at the peripheral edge of said vibratile disc assembly.

4. The invention in claim 3 characterized in that said membrane is metal.

5. The invention in claim 4 further characterized in that said flexible annulus is a thinned undercut portion of a metallic disc, and still further characterized in that the center circular disc portion remaining inside said flexible undercut portion becomes part of the vibratile disc assembly when it is bonded to said piezoelectric disc.

6. In combination in an electroacoustic transducer, a flexurally vibratile disc assembly comprising a plurality of bonded discs at least one of which is a piezoelectric material which has the property of changing its radial dimension when a voltage is applied across the opposite surfaces of said piezoelectric disc, a support member for supporting said vibratile disc assembly, said support member characterized in that the flexural stiffness of said support member is less than the flexural stiffness of said vibratile disc assembly, whereby said support member does not significantly impede the free flexural displacement of the peripheral edge of said vibratile disc assembly when it is vibrating at its fundamental free flexural resonant mode, said vibratile disc assembly further characterized in that when it is operating at its fundamental free resonant frequency mode of vibration, the displacement of the outer peripheral area of the vibratile surface of said disc assembly is of opposite phase compared with the displacement of the central area of the vibratile surface of said disc assembly, an acoustic delay line comprising a plate member having a center opening, said plate member located in spaced proximity to the vibratile surface of said composite vibratile disc and positioned so that the center of the opening in said plate member is in alignment with the central area of said vibratile surface of said vibratile disc assembly, said plate member further characterized in that the area of the opening does not exceed 50% of the area of the composite vibratile disc, said composite vibratile disc further characterized in that the radius of said vibratile disc is greater than ¼ wavelength and less than ¾ wavelength of the sound generated by said vibratile disc at the frequency of operation, said support member further characterized in that it does not shield any significant portion of the vibratile surface of the disc assembly and that it does not introduce any significant attenuation to the sound vibrations generated by the outer peripheral portion of the vibratile surface area of said flexurally vibrating disc when it is operating at its fundamental free resonant mode of vibration.

7. The invention in claim 6 further characterized in that said support member is a resilient rubber-like material.

8. The invention in claim 7 further characterized in that said rubber-like material is a foam composition.

9. The invention in claim 8 further characterized in that said resilient support member provides a peripheral seal between the peripheral edge of said vibratile disc and the periphery of said acoustic delay line.

10. The invention in claim 9 further characterized in that said resilient support member also provides a spacing means between the surface of the vibratile disc and the proximate surface of the acoustic delay line plate member.

* * * * *